(12) United States Patent
Baker

(10) Patent No.: US 7,330,390 B2
(45) Date of Patent: *Feb. 12, 2008

(54) NOISE RESISTANT SMALL SIGNAL SENSING CIRCUIT FOR A MEMORY DEVICE

(75) Inventor: R. Jacob Baker, Meridian, ID (US)

(73) Assignee: Micron Technology, Inc, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/449,546

(22) Filed: Jun. 7, 2006

(65) Prior Publication Data

US 2006/0227641 A1    Oct. 12, 2006

Related U.S. Application Data

(60) Continuation of application No. 10/915,088, filed on Aug. 9, 2004, now Pat. No. 7,095,667, which is a division of application No. 10/683,539, filed on Oct. 10, 2003, now Pat. No. 6,798,705, which is a division of application No. 10/147,668, filed on May 16, 2002, now Pat. No. 6,826,102.

(51) Int. Cl.
| | |
|---|---|
| G11C 7/02 | (2006.01) |
| G11C 7/06 | (2006.01) |
| G11C 5/14 | (2006.01) |
| H03K 9/08 | (2006.01) |
| H03K 5/22 | (2006.01) |
| H03K 17/00 | (2006.01) |
| H03K 4/02 | (2006.01) |

(52) U.S. Cl. ............ 365/207; 365/189.07; 365/189.09; 365/233; 327/37; 327/65; 327/124; 327/127

(58) Field of Classification Search ................ 365/205, 365/207, 233, 189.07, 189.09; 327/28, 37, 327/65, 124, 127
See application file for complete search history.

(56) References Cited

U.S. PATENT DOCUMENTS

| | | | |
|---|---|---|---|
| 3,818,501 A | 6/1974 | Fiorino | 360/40 |
| 3,979,740 A | 9/1976 | Forbat et al. | 340/276 |
| 4,190,823 A * | 2/1980 | Leichle | 341/141 |
| 4,197,515 A | 4/1980 | Hornfeldt et al. | 333/165 |
| 4,281,291 A | 7/1981 | Lamare et al. | 329/50 |
| 4,369,501 A | 1/1983 | Brown et al. | 365/8 |
| 4,450,387 A | 5/1984 | Reed et al. | 315/375 |
| 4,536,851 A | 8/1985 | Germanton et al. | 364/557 |
| 4,559,453 A | 12/1985 | Muggli et al. | 250/565 |
| 4,718,036 A | 1/1988 | Halbert et al. | 364/829 |
| 5,243,544 A | 9/1993 | Schoess | 364/566 |
| 5,281,860 A | 1/1994 | Krenik et al. | 307/243 |
| 5,329,480 A | 7/1994 | Wu et al. | 365/170 |

(Continued)

*Primary Examiner*—Ly Duy Pham
(74) *Attorney, Agent, or Firm*—Dorsey & Whitney LLP

(57) ABSTRACT

Apparatus and method for data sensing circuitry that uses averaging to sense small differences in signal levels representing data states. The apparatus periodically switches the coupling of input terminals and output terminals of an integrator circuit from a first configuration to a second configuration, where the second configuration changes the polarity of the integrator circuit from the first configuration. The output signals of the integrator circuit are periodically compared, and based on the comparison, output signals having a voltage representative of a value are generated. The values of the output signals are then averaged over time to determine the data state.

33 Claims, 6 Drawing Sheets

U.S. PATENT DOCUMENTS

| | | | |
|---|---|---|---|
| 5,754,470 A | 5/1998 | Engh et al. | 365/185.03 |
| 5,801,652 A | 9/1998 | Gong | 341/131 |
| 5,805,871 A * | 9/1998 | Baxter | 713/500 |
| 5,907,299 A | 5/1999 | Green et al. | 341/143 |
| 5,959,441 A | 9/1999 | Brown | 323/282 |
| 5,986,598 A | 11/1999 | Mittel | 341/143 |
| 5,999,454 A | 12/1999 | Smith | 365/185.21 |
| 6,038,166 A | 3/2000 | Wong | 365/185.03 |
| 6,128,239 A | 10/2000 | Perner | 365/209 |
| 6,188,615 B1 | 2/2001 | Perner et al. | 365/189.01 |
| 6,243,034 B1 | 6/2001 | Regier | 341/166 |
| 6,317,375 B1 | 11/2001 | Perner | 365/206 |
| 6,317,376 B1 | 11/2001 | Tran et al. | 365/210 |
| 6,385,111 B2 | 5/2002 | Tran et al. | 365/210 |
| 6,396,329 B1 | 5/2002 | Zerbe | 327/336 |
| 6,414,882 B1 | 7/2002 | Butler | 365/189.09 |
| 6,504,750 B1 | 1/2003 | Baker | 365/148 |
| 6,567,318 B2 | 5/2003 | Bedarida et al. | 365/189.05 |
| 6,678,187 B2 | 1/2004 | Sugibayashi et al. | 365/158 |
| 6,697,444 B1 | 2/2004 | Iizuka et al. | 375/343 |
| 6,788,563 B2 | 9/2004 | Thompson et al. | 365/145 |
| 6,798,705 B2 | 9/2004 | Baker | 365/207 |
| 6,813,208 B2 | 11/2004 | Baker | 365/207 |
| 6,822,892 B2 | 11/2004 | Baker | 365/148 |
| 6,826,102 B2 | 11/2004 | Baker | 365/207 |
| 6,856,564 B2 | 2/2005 | Baker | 365/207 |
| 6,885,580 B2 * | 4/2005 | Baker | 365/158 |
| 6,914,839 B2 * | 7/2005 | Chow et al. | 365/207 |
| 6,954,390 B2 | 10/2005 | Baker | 365/207 |
| 6,954,391 B2 | 10/2005 | Baker | 365/207 |
| 6,954,392 B2 * | 10/2005 | Baker | 365/209 |
| 7,009,901 B2 | 3/2006 | Baker | 365/207 |
| 7,095,667 B2 * | 8/2006 | Baker | 365/207 |
| 2002/0101251 A1 | 8/2002 | Shimizu | 324/677 |
| 2002/0117895 A1 | 8/2002 | Kemp et al. | 307/10.1 |
| 2002/0126524 A1 | 9/2002 | Sugibayashi et al. | 365/158 |
| 2002/0153936 A1 | 10/2002 | Zerbe | 327/336 |
| 2003/0083584 A1 | 5/2003 | Yonce | 600/509 |
| 2003/0151532 A1 | 8/2003 | Chen et al. | 341/120 |
| 2003/0198075 A1 | 10/2003 | Brown | 365/145 |
| 2003/0214868 A1 | 11/2003 | Baker | 365/207 |
| 2004/0091035 A1 | 5/2004 | Palaskas et al. | 375/229 |

* cited by examiner

NOISE RESISTANT SMALL SIGNAL SENSING CIRCUIT FOR A MEMORY DEVICE

CROSS-REFERENCE TO RELATED APPLICATION

This application is a continuation of U.S. patent application Ser. No. 10/915,088, filed Aug. 9, 2004, now Pat. No. 7,095,667,which is a divisional of U.S. patent application Ser. No. 10/683,539, filed Oct. 10, 2003, issued Sep. 28, 2004 as U.S. Pat. No. 6,798,705 B2, which is a divisional of U.S. patent application Ser. No. 10/147,668, filed May 16, 2002, issued Nov. 30, 2004 as U.S. Pat. No. 6,826,102 B2.

TECHNICAL FIELD

The present invention relates generally to integrated circuit memory devices, and more specifically, to sensing circuitry for sensing small resistance differences in memory cells, such as in resistive memory cells.

BACKGROUND OF THE INVENTION

Computer systems, video games, electronic appliances, digital cameras, and myriad other electronic devices include memory for storing data related to the use and operation of the device. A variety of different memory types are utilized in these devices, such as read only memory (ROM), dynamic random access memory (DRAM), static random access memory (SRAM), flash memory (FLASH), and mass storage such as hard disks and CD-ROM or CD-RW drives. Each memory type has characteristics that better suit that type to particular applications. For example, DRAM is slower than SRAM but is nonetheless utilized as system memory in most computer systems because DRAM is inexpensive and provides high density storage, thus allowing large amounts of data to be stored relatively cheaply. A memory characteristic that often times determines whether a given type of memory is suitable for a given application is the volatile nature of the storage. Both DRAM and SRAM are volatile forms of data storage, which means the memories require power to retain the stored data. In contrast, mass storage devices such as hard disks and CD drives are nonvolatile storage devices, meaning the devices retain data even when power is removed.

Current mass storage devices are relatively inexpensive and high density, providing reliable long term data storage at relatively cheap. Such mass storage devices are, however, physically large and contain numerous moving parts, which reduces the reliability of the devices. Moreover, existing mass storage devices are relatively slow, which slows the operation of the computer system or other electronic device containing the mass storage device. As a result, other technologies are being developed to provide long term nonvolatile data storage, and, ideally, such technologies would also be fast and cheap enough for use in system memory as well. The use of FLASH, which provides nonvolatile storage, is increasing in popularity in many electronic devices such as digital cameras. While FLASH provides nonvolatile storage, FLASH is too slow for use as system memory and the use of FLASH for mass storage is impractical, due in part to the duration for which the FLASH can reliably store data as well as limits on the number of times data can be written to and read from FLASH.

Due to the nature of existing memory technologies, new technologies are being developed to provide high density, high speed, long term nonvolatile data storage. One such technology that offers promise for both long term mass storage and system memory applications is Magneto-Resistive or Magnetic Random Access Memory (MRAM). FIG. 1 is a functional diagram showing a portion of a conventional MRAM array 100 including a plurality of memory cells 102 arranged in rows and columns. Each memory cell 102 is illustrated functionally as a resistor since the memory cell has either a first or a second resistance depending on a magnetic dipole orientation of the cell, as will be explained in more detail below. Each memory cell 102 in a respective row is coupled to a corresponding word line WL, and each memory cell in a respective column is coupled to a corresponding bit line BL. In FIG. 1, the word lines are designated WL1-3 and the bit lines designated BL1-4, and may hereafter be referred to using either these specific designations or generally as word lines WL and bit lines BL. Each of the memory cells 102 stores information magnetically in the form of an orientation of a magnetic dipole of a material forming the memory cell, with a first orientation of the magnetic dipole corresponding to a logic "1" and a second orientation of the magnetic dipole corresponding to a logic "0." The orientation of the magnetic dipole of each memory cell 102, in turn, determines a resistance of the cell. Accordingly, each memory cell 102 has a first resistance when the magnetic dipole has the first orientation and a second resistance when the magnetic dipole has the second orientation. By sensing the resistance of each memory cell 102, the orientation of the magnetic dipole and thereby the logic state of the data stored in the memory cell 102 can be determined.

The stored logic state can be detected by measuring the memory cell resistance using Ohm's law. For example, resistance is determined by holding voltage constant across a resistor and measuring, directly or indirectly, the current that flows through the resistor. Note that, for MRAM sensing purposes, the absolute magnitude of resistance need not be known, the inquiry is whether the resistance is greater or less than a value that is intermediate to the logic high and logic low states. Sensing the logic state of an MRAM memory element is difficult because the technology of the MRAM device imposes multiple constraints. In a typical MRAM device, an element in a high resistance state has a resistance of about 950 k$\Omega$. The differential resistance between a logic "1" and a logic "0" is thus about 50 k$\Omega$, or approximately 5% of scale.

Therefore, there is a need for a sensing circuit for a resistance measuring circuit to repeatably and rapidly distinguish resistance values for devices having small signal differentials.

SUMMARY OF THE INVENTION

The present invention is directed to an apparatus and method for data sensing that uses averaging to sense small differences in signal levels representing data states. The apparatus includes an integrator circuit having a first integrator input electrically coupled to a reference level, a second integrator input to which an input is applied, and first and second integrator outputs at which first and second output signals are provided, respectively. The integrator circuit further includes an amplifier circuit having pairs of differential input and output nodes. The integrator circuit periodically switches the electrical coupling of each of the differential input nodes to a respective integrator input and the electrical coupling of each of the differential output nodes to a respective integrator output. The apparatus further includes a comparator having first and second input nodes electrically coupled to a respective integrator output and further having an output node. The clocked comparator periodically compares voltage levels of the first and second input nodes and generating an output signal having a logic state based therefrom. A current source having first and second current output nodes coupled to a respective integrator output is also included in the apparatus. The current source switching the coupling of each current output node to a integrator output based on the logic state of the output signal of the comparator.

DETAILED DESCRIPTION OF THE INVENTION

Embodiments of the present invention are directed to a noise resistant sensing circuit for data sensing circuitry that uses averaging to sense small differences in signal levels representing data states, such as in resistor-based memory circuits. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
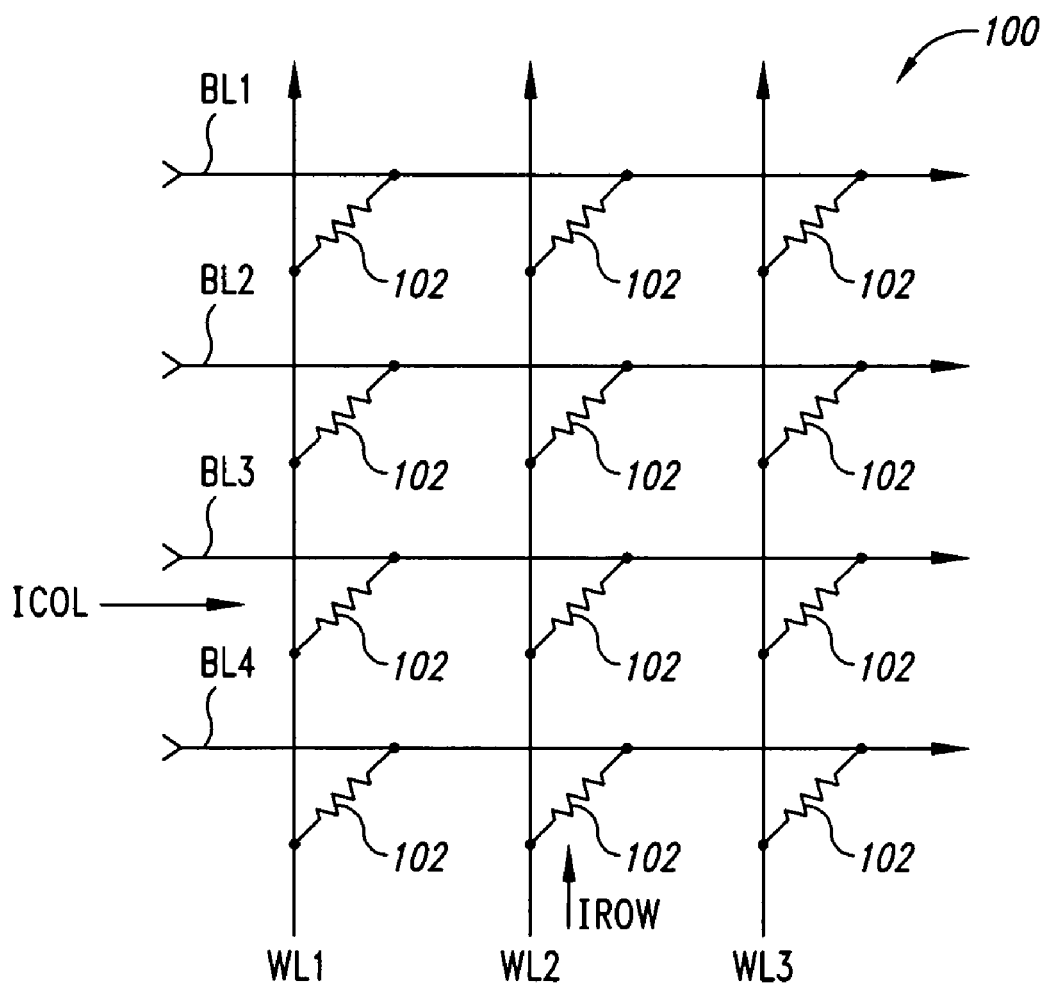
FIG. 1 is a functional block diagram showing a portion of a conventional MRAM array.
Figure 2:
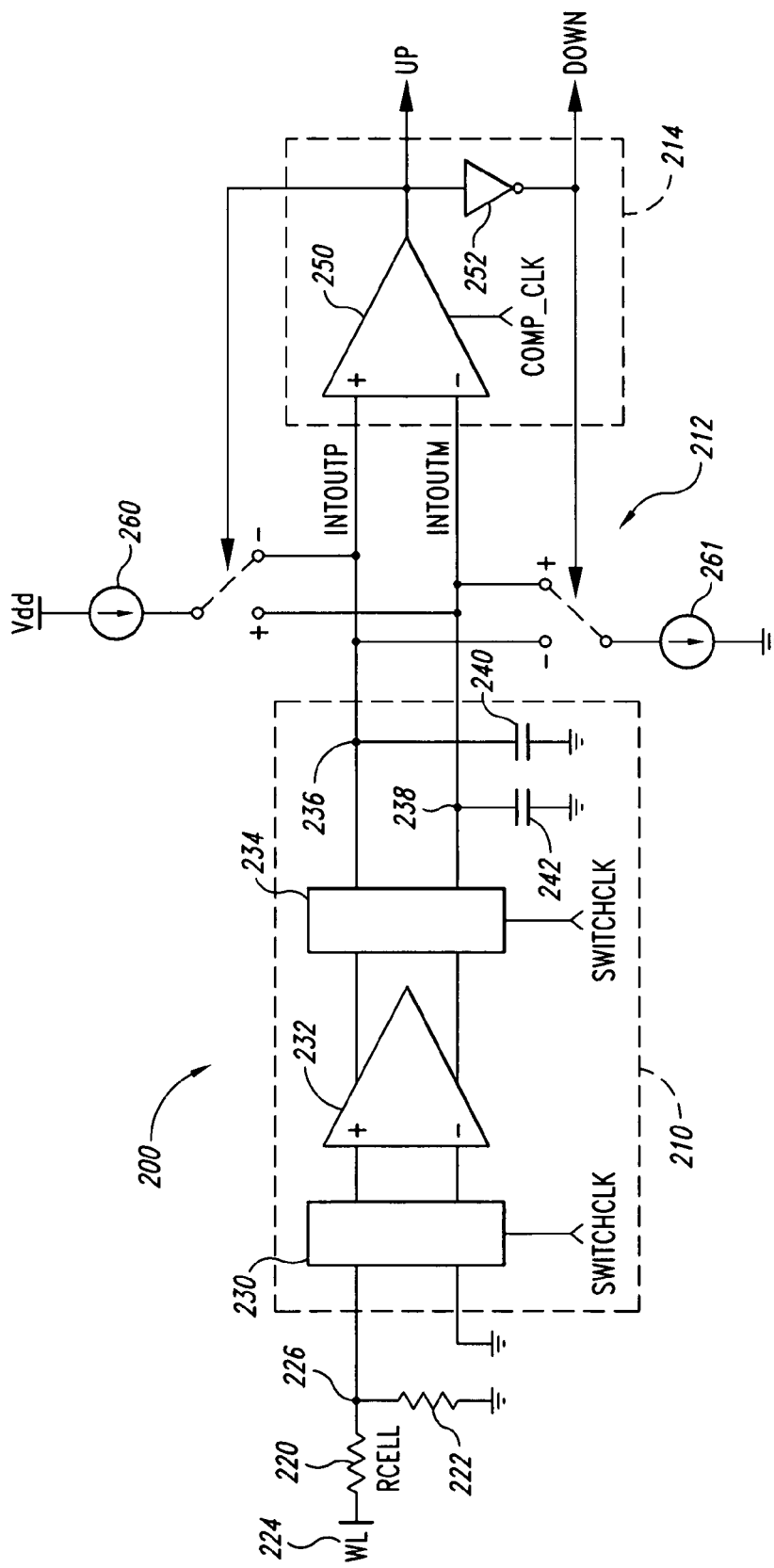
FIG. 2 is a functional block diagram of a sensing circuit according to an embodiment of the present invention.

FIG. 2 illustrates an embodiment of a sensing circuit 200 according to an embodiment of the present invention. The sensing circuit 200 includes an integrator stage 210, a switching current source 212, and a clocked comparator 214. As will be explained in more detail below, an output signal UP (or DOWN) of the sensing circuit 200 is averaged over a period of time to determine the data state stored on a memory cell, such as a resistive memory cell 220. The average value calculated is indicative of the data state of the memory cell. In summary, the sensing circuit 200 outputs a stream of bits resulting from the cyclical charging and discharging of capacitors 340, 342. The ratio of logic "1" bits (or alternatively, logic "0" bits) to a total number of bits yields a numerical value that corresponds to an average current through a memory cell, such as resistive memory cell 220, in response to an applied voltage. The average current, in turn, is used to determine the logic state of the data stored by the resistive memory cell 220. Circuitry for performing the averaging operation of the bit stream provided by the sensing circuit 200 has not been shown or described in great detail in order to avoid obscuring description of the present invention. A more detailed explanation of using current averaging for memory cell sensing is provided in the commonly assigned, co-pending U.S. patent application Ser. No. 09/938,617, filed Aug. 27, 2001, entitled RESISTIVE MEMORY ELEMENT SENSING USING AVERAGING, which is incorporated herein by reference.

A potential issue, however, with the circuit described in the aforementioned patent application is related to offset voltages and currents inherent with the differential amplifier of the sensing circuit, as well as $1/f$ noise. It will be appreciated that these effects can cause currents in the tens of nano-amperes to be output by the differential amplifier. In light of the small voltage margin between two data states of a memory cell, such as a resistive memory cell, and the resulting magnitude of output current (~100 nA range) by the differential amplifier when reading the memory cell, inherent offset voltages and currents, as well as $1/f$ noise can cause reading errors if not compensated. In the sensing circuit described in the aforementioned patent, offset issues are compensated for by calibrating the differential amplifier. However, it is often the case that the calibration must be adjusted for process variations in fabrication of the memory device. Additionally, the process of calibrating the differential amplifiers of a memory device is time consuming. As will be explained in more detail below, embodiments of the present invention, including the arrangement illustrated in FIG. 2, provide offset and $1/f$ noise compensation without the need for calibration, and allows for the integration to run indefinitely.

The operation of the sensing circuit 200 will be described generally with respect to FIG. 2. The resistance Rcell of the resistive memory cell 220 is measured as an input voltage relative to ground. In reading a memory cell, a wordline (WL) 224 corresponding to a row address is activated and goes HIGH, and bit lines of a memory array are coupled to the input nodes 226 of the respective sensing circuits 200. All other wordlines in the memory array are grounded. As illustrated in FIG. 2, the voltage level of the selected WL 224 is dropped over Rcell and a "sneak" resistance 222 that represents the resistance of the other resistive memory cells of the bit line coupled to the input node 226, but not coupled to the selected WL 224. Note that the ground node coupled to the sneak resistance 222 represents the unselected, that is, grounded, wordlines.

For the present example, operation of first and second chopping or switching circuits 230, 234 will be ignored until later in order to simplify the explanation of the sensing circuit 200. The voltage applied to the input node 226 causes a differential amplifier 232 to supply current to either node 236 or 238, and draw current from the other node. As a result, the capacitor coupled to the node to which the differential amplifier 232 is supplying a current will be charged, increasing the voltage of the node. Conversely, the capacitor coupled to the node from which the differential amplifier 232 is drawing current will be discharged, decreasing the voltage of that node. A clocked comparator 250 senses the relative voltages of the nodes 236, 238 in response to a clock signal Comp_clk and generates a corresponding output signal UP. The clocked comparator 250 also generates a complementary output signal DOWN. As illustrated in FIG. 2, an inverter 252 is coupled to the output of the clocked comparator 250 to generate the DOWN signal. However, it will be appreciated that the clocked comparator 250 is provided by way of example, and a clocked comparator suitable for use with the present invention can be implemented in many different ways other than that shown in FIG. 2.

The UP and DOWN signals are provided to the switching current source 212 having a first current source 260 and a second current source 261. Each of the current sources 260, 261 switch between being coupled to the nodes 236, 238 based on the state of the UP and DOWN signals. In one state, the current source 260 is coupled to the node 236, providing current to positively charge the capacitor 236, and the current source 261 is coupled to the node 238, providing current to negatively charge the capacitor 238. In the other state, the current source 260 is coupled to the node 238, providing current to positively charge the capacitor 238, and the current source 261 is coupled to the node 236, providing current to negatively charge the capacitor 236. Consequently, where the UP and DOWN signals switch states, the coupling of the current sources 260, 261 will switch as well.

For example, as illustrated in FIG. 2, the UP and DOWN signals are LOW and HIGH, respectively, causing the current source 260 to be coupled to the node 236 and the current source to be coupled to the node 238. Upon the next rising edge of the Comp_clk signal, the voltages of the nodes 236, 238 are sensed by the clocked comparator 250. The voltages at the nodes 236, 238 are represented by signals intout1$p$ and intout1$m$, respectively. Where the coupling of the current sources 260, 261 are such that the current provided to the capacitors 240, 242 over the period of the Comp_clk signal causes the voltages of the nodes 236, 238 to change from the previous rising edge of the Comp_clk signal, the output of the clocked comparator 250 changes logic states. This in turn causes the coupling of the current sources 260, 261 to switch nodes as well. It will be appreciated that the coupling of the current sources 260, 261 will continue to switch until the current provided by the differential amplifier 232 to either one of the capacitors 240, 242 causes the voltage of the respective node 236, 238 to be greater than the change in voltage caused by the current source over one period of the Comp_clk signal. When this occurs, the logic states of the UP and DOWN signals maintain their present logic states, which causes the average of the output signal of the sensing circuit 200 to change.

As previously mentioned, operation of the first and second switching circuits 230, 234 has been ignored. Operation of the first and second switching circuits 230, 234 will now be discussed. Explained briefly, the first and second switching circuits 230, 234 are used to zero out any inherent offset with the differential amplifier 232 and 1/$f$ noise. As previously discussed, offset voltages and currents, as well as 1/$f$ noise cause reading errors if not compensated. As will be explained in more detail below, in embodiments of the present invention, offset and 1/$f$ noise compensation can be provided without the need for calibration, and additionally, integration can be run indefinitely.

Figure 3:
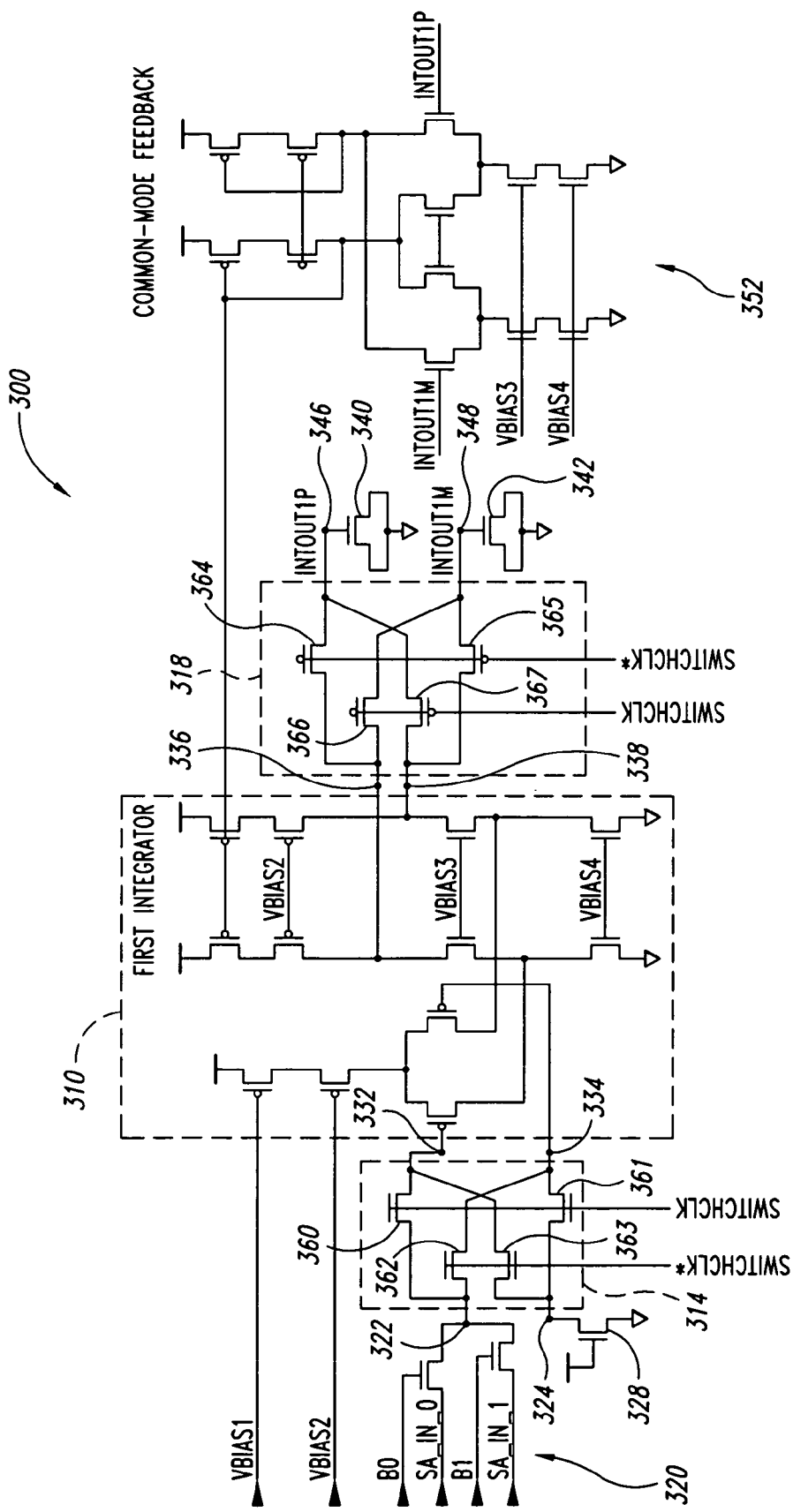
FIG. 3 is a schematic drawing of an integrator stage according to an embodiment of the present invention.

FIG. 3 illustrates an embodiment of an integrator stage 300 that can be substituted for the integrator stage 210 in FIG. 2. The integrator stage 300 includes an input multiplexer 320 coupled to a first switching circuit 314 at an input node 322. The multiplexer 320 selects between coupling a first digit line signal SA_in_0 and a second digit line signal SA_in_1 to the input node 322 based on the logic states of address signals B0 and B1. The address signals B0 and B1 are conventional, and provision of these types of signals to the integrator stage 300 are well known in the art. A second input node 324 of the first switching circuit 314 is coupled to ground through a transistor 328. The gate of the transistor 328 is coupled to a power supply making the transistor 328 conductive. Output nodes 332, 334 are coupled to non-inverting and inverting inputs of the differential amplifier 310, respectively. Non-inverting and inverting outputs of the differential amplifier 310 are coupled to input nodes 336, 338, respectively, of the second switching circuit 318. Output nodes 346, 348 of the second switching circuit 318 are coupled to capacitors 340, 342, respectively. As previously discussed, the intout1$p$ and intout1$m$ signals provided by the integrator stage 210 (FIG. 2) to the clocked comparator 214 represent the voltages at the nodes 346, 348 as the capacitors 340, 342 charge and discharge. The integrator stage 300 further includes a common-mode feedback circuit 352 coupled to the output nodes 346, 348 of the second switching circuit 318 to limit the output current of the differential amplifier 310 to a differential current. The voltages, Vbias1, Vbias2, Vbias3, and Vbias4, illustrated in FIG. 3 are bias voltages that can be generated and provided to the integrator stage 300 in any conventional manner. It will be appreciated that selection of the specific voltage levels can be made by those of ordinary skill in the art based on the description of the present invention provided herein.

Operation of the integrator stage 300 is essentially the same as previously explained with respect to FIG. 2. However, operation of the integrator stage 300 is modified by the operation of the first and second switching circuits 314, 318. The first and second switching circuits 314, 318 receive complementary clock signals switchclk and switchclk*. The switchclk and switchclk* signals can be generated in any conventional manner, and typically have a lower frequency than the Comp_clk signal provided to the clocked comparator 214 (FIG. 2). The switching circuits 314, 318 generally switch the coupling of the input nodes to the output nodes back-and-forth in synchronicity with the switchclk signal. As will be explained in more detail below, by periodically switching the coupling of the input and output nodes of the switching circuits 314, 318, and then making a determination of the data value stored in a memory cell by averaging multiple samples, any offset issues with the integrator circuit 310 and 1/$f$ noise can be averaged out.

For example, assume that the differential amplifier 310 has an offset that causes a first offset current to flow out of differential amplifier at the node 336 (i.e., positive polarity) and a second offset current to flow into the differential amplifier at the node 338 (i.e., negative polarity). When the switchclk signal transitions HIGH, NMOS transistors 360, 361 of the first switching circuit 314 become conductive, coupling the input node 322 to the output node 332, and coupling the input node 324 to the output node 334. As for the second switching circuit 318, PMOS transistors 364, 365 become conductive, coupling the input node 336 to the output node 346, and coupling the input node 338 to the output node 348. Thus, during the time the switchclk signal is HIGH, the positive polarity of the first offset current adds to the output current applied to the capacitor 340 and the negative polarity of the second offset current subtracts from the output current applied to the capacitor 342.

When the switchclk signal transitions LOW, however, the coupling of the input and output nodes of the first and second switching circuits 314, 318 switch. That is, when the switchclk signal is LOW, NMOS transistors 362, 363 of the first switching circuit 314 become conductive (and NMOS transistors 360, 361 switch OFF), switching the coupling of the input node 322 to the output node 334 and the coupling off the input node 324 to the output node 332. Similarly, in the second switching circuit 318, PMOS transistors 366, 367 become conductive (and PMOS transistors 364, 365 switch OFF) switching the coupling of the input node 336 to the output node 348, and the coupling of the input node 338 to the output node 346. In this arrangement, the first offset current now adds to the output current applied to the capacitor 342 and the second offset current now subtracts from the output current applied to the capacitor 340.

As a result of the switching of the input and output nodes of the switching circuits 314 and 318, the positive and negative offset currents are applied to each of the capacitors for an equal time. Thus, where the data state of a memory cell is based on the average of multiple samples taken over a period of time (preferably a multiple of the switchclk signal), the offset currents inherent with the differential amplifier 310 can be averaged out.

Figure 4:
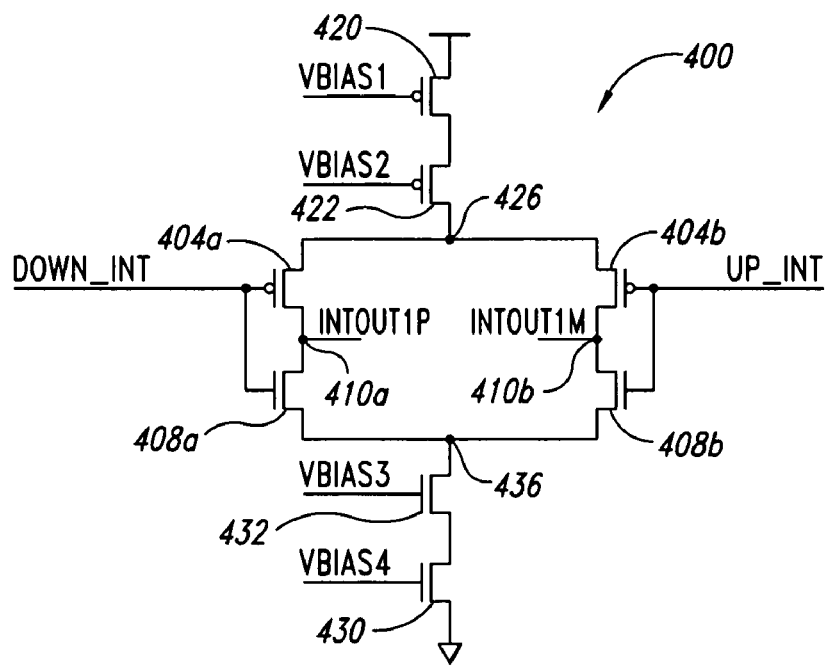
FIG. 4 is a schematic drawing of a switching current source according to an embodiment of the present invention.

FIG. 4 illustrates an embodiment of a current source 400 that can be substituted for the current sources 260, 261 illustrated in FIG. 2. The current source includes PMOS transistors 420, 422 that couple a power supply having a voltage of Vdd to a node 426, and NMOS transistors 430, 432 that couple a node 436 to ground. Each of the PMOS and NMOS transistors 420, 422, 430, and 432 have a respective voltage applied to their gates to set the conductivity. As previously discussed, the voltages, Vbias1, Vbias2, Vbias3, and Vbias4, are selected to set the magnitude of current supplied to the nodes 426 and 436. These voltages can be generated and provided to the current source 400 in any conventional manner.

The current source 400 further includes PMOS switching transistors 404a, 404b and NMOS switching transistors 408a, 408b. The Down_int and Up_int signals are applied to the gates of the transistors 404a, 408a and 404b, 408b, respectively. The switching transistors 404a, 408a, 404b, 408b, alternatively couple nodes 410a, 410b to either the power supply or ground, depending on the logic states of the Down_int and Up_int signals. As previously discussed, the Down_int and Up_int signals have complementary logic states, and are generated as output signals of the clocked comparator 214 (FIG. 2). The nodes 410a, 410b represent the nodes to which the capacitors of the integrator stage 210 (FIG. 2) are coupled. Thus, because of their complementary logic states, the nodes 410a, 410b are alternatively charged or discharged based on the switching of the Down_int and Up_int signals.

In operation, when the Up_int signal is HIGH (and the Down_int signal is LOW), current is being supplied to the node 410a and drawn from the node 410b. When the Up_int and Down_int signals switch to LOW and HIGH, respectively, current is then drawn from the node 410a and supplied to the node 410b. As the Up_int and Down_int signals continue to switch logic states, the current supplied or sunk alternates between the nodes 410a, 410b as well.

Figure 5:
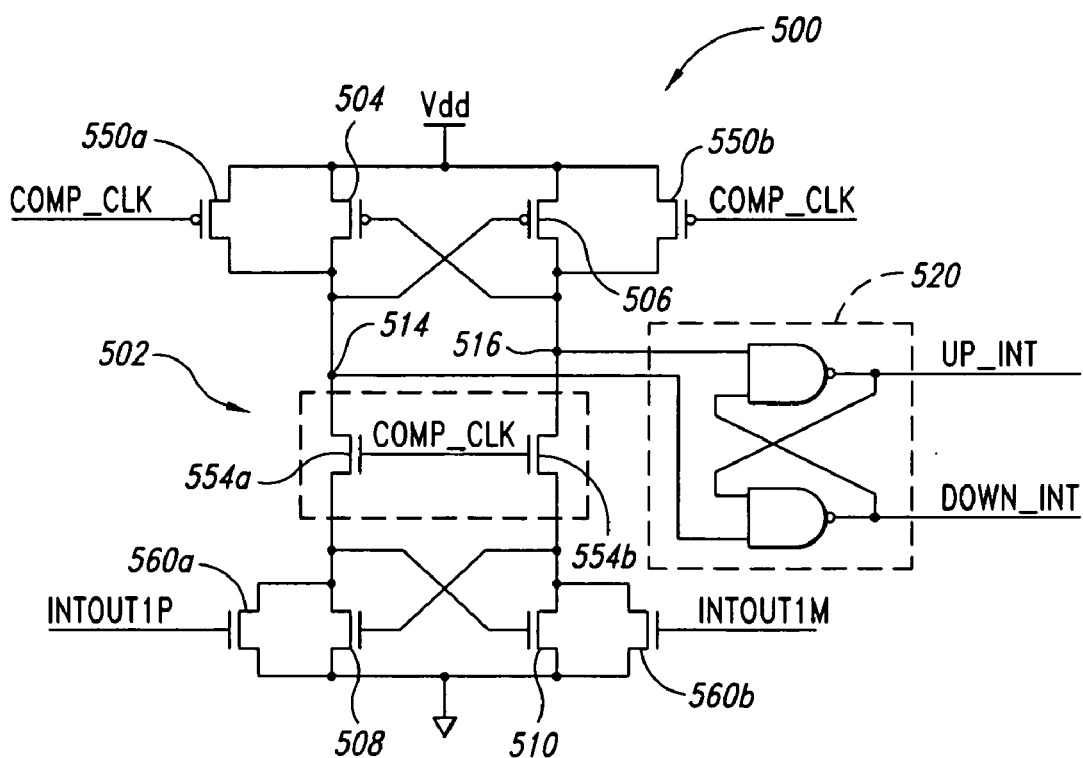
FIG. 5 is a schematic drawing of clocked comparator according to an embodiment of the present invention.

FIG. 5 illustrates an embodiment of a clocked comparator 500 that can be substituted for the clocked comparator 214 illustrated in FIG. 2. The clocked comparator 500 includes a latch circuit 502 formed from cross-coupled PMOS transistors 504, 506 and cross-coupled NMOS transistors 508, 510. A first logic state and a complementary second logic state are latched at nodes 514 and 516, respectively. Coupled to the nodes 514 and 516 is an active-low set-reset (SR) flip-flop 520 having two output nodes at which Up_int and Down_int signals are provided. The Up_int and Down_int signals are provided to an averaging circuit (not shown) for determination of the data state of a memory cell. The active-low SR flip-flop 520 is conventional in design and operation. That is, where the logic state at the node 516 switches to LOW, the Up_int signal will be HIGH, and where the logic state at the node 514 switches to LOW, the Down_int signal will be HIGH. Where the logic state at both the nodes 514 and 516 are HIGH, the Up_int and Down_int signals will remain the same.

PMOS transistors 550a, 550b are coupled in parallel to the PMOS transistors 504 and 506, respectively. NMOS transistors 554a, 554b are coupled between the cross-coupled PMOS transistors 504 and 506 and the cross-coupled NMOS transistors 508 and 510. A Comp_clk clock signal is applied to the gates of PMOS transistors 550a, 550b and the NMOS transistors 554a, 554b. The Comp_clk signal can be produced in any conventional manner. The clocked comparator 500 further includes NMOS transistors 560a, 560b coupled in parallel to the NMOS transistors 508 and 510, respectively. The intout1p and intout1m signals are applied to the gates of the NMOS transistors 508 and 510, respectively.

In operation, the clocked comparator 500 provides Up_int and Down_int signals in synchronicity with the Comp_clk signal for averaging based on logic state of the intout1p and intout1m signals of the integrator stage 210 (FIG. 2). Starting at the rising edge of the Comp_clk signal, the clocked comparator 500 sets the logic state of the Up_int and Down_int signals based on the logic state of the intout1p and intout1m signals. Upon the falling edge of the Comp_clk signal, the logic states of the intout1p and intout1m signals are maintained in their present state until the period of the Comp_clk signal is complete.

For example, during the time the Comp_clk signal is HIGH, the latch circuit 502 is "active," latching logic states at the nodes 514, 516 in response to the logic states of the intout1p and intout1m signals. Note, that during the time the Comp_clk signal is HIGH, both the PMOS transistors 550a, 550b are OFF, thus, allowing the nodes 514, 516 to be set according to the logic states of the intout1p and intout1m signals. When the latch circuit 502 is active, and the intout1m signal is HIGH, the node 516 is pulled LOW, activating the PMOS transistor 504. This in turn pulls the node 514 HIGH and activates the NMOS transistor 510. As a result, the Up_int signal provided at the output of the active-low SR flip-flop 520 switches or remains HIGH, and the Down_int signal switches or remains LOW. Upon the Comp_clk signal going LOW, both the NMOS transistors 554a, 554b are switched OFF isolating the nodes 514 and 516 from the cross coupled NMOS transistors 508 and 510. Additionally, both the PMOS transistors 550a, 550b become conductive, and the nodes 514, 516 are coupled to a power supply having a voltage of Vdd, pulling the nodes 514, 516 HIGH. As previously mentioned, when both the inputs of the active-low SR flip-flop 520 are HIGH, the logic state of the Up_int and Down_int signals are maintained in their present state.

When the Comp_clk signal goes HIGH again, and the logic states of the intout1m and intout1p signals have switched to LOW and HIGH, respectively, the node 514 will be pulled LOW and the node 516 will be pulled HIGH. As a result, the Up_int and Down_int signals will switch as well, with the Up_int signal changing from a HIGH logic state to a LOW one, and the Down_int signal changing from a LOW logic state to a HIGH one. For the remainder of the Comp_clk cycle, the logic states of the Up_int and Down_int signals will be maintained in their present state.

It will be appreciated that the embodiments of the integrator stage 300, the current source 400, and the clocked comparator 500 shown in FIGS. 3-5 and previously discussed, have been provided by way of example. The description provided herein is sufficient to enable one of ordinary skill in the art to implement the previously described circuits and provide the same functionality and operability, but in alternative manners. It will be further appreciated that modifications such as these are well within the scope of the present invention.

Figure 6:
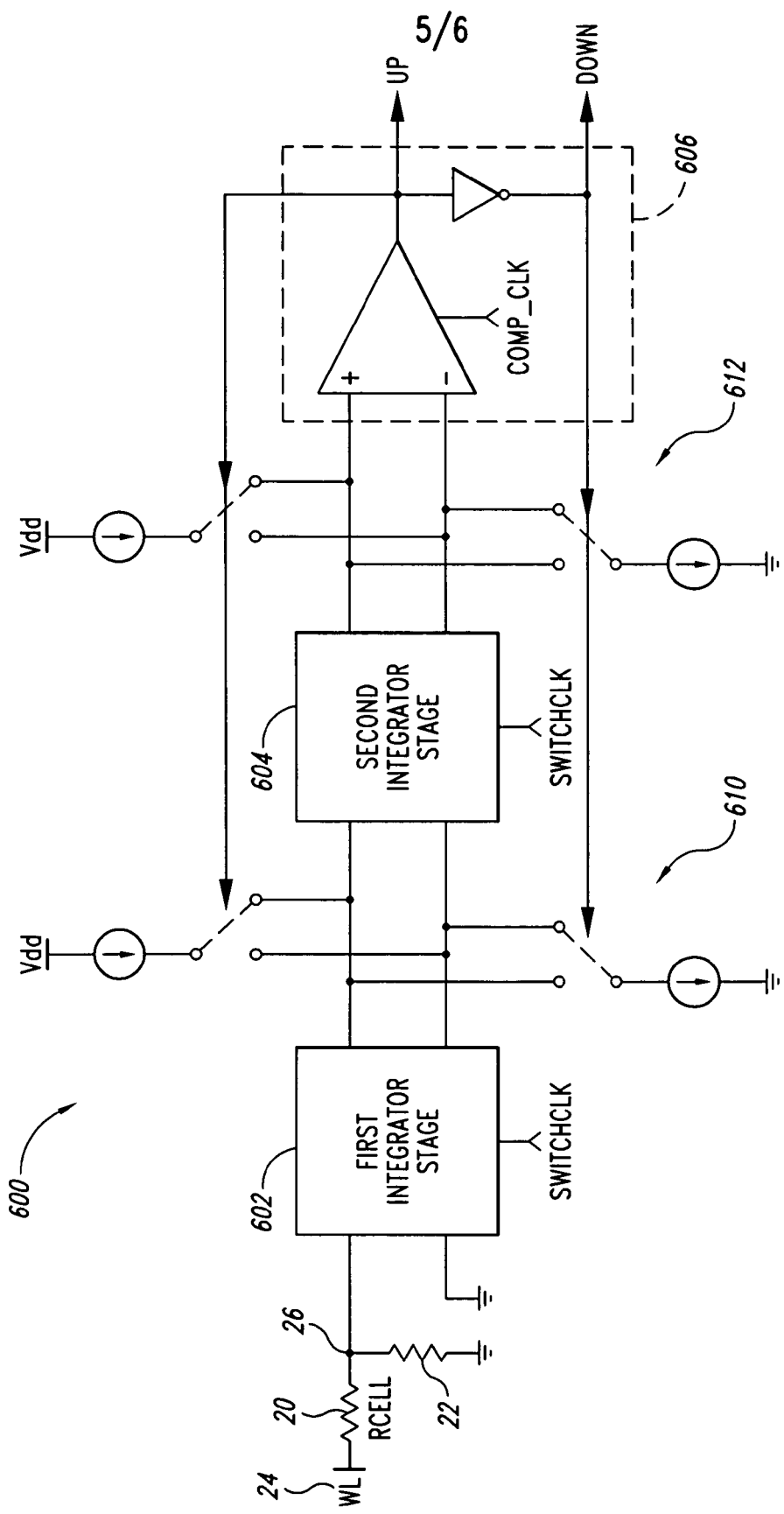
FIG. 6 is a functional block diagram of a sensing circuit according to another embodiment of the present invention.

FIG. 6 illustrates a sensing circuit 600 according to an alternative embodiment of the present invention. The sensing circuit 600 includes a first integrator stage 602, a second integrator stage 604, a clocked comparator 606, and first and second switched current sources 610, 612. Operation of the sensing circuit 600 is similar to the operation of the sensing circuit 200 illustrated in FIG. 2. The sensing circuit 600 is different in that a second integrator stage 604 and a second switched current source 612 has been included. The second integrator stage 604 provides increased gain over the sensing circuit 200, as well as second order noise shaping. The integrator stage 200 can be substituted for the integrator stages 602, 604. However, switching circuits, similar to first and second switching circuits 230, 234 (FIG. 2) can be omitted from the second integrator stage since the voltage levels of the output signals from the first integrator stage 602 is great enough where inherent offsets in the second integrator stage 604 and 1/f noise is less likely to cause reading errors. It will be appreciated that the description provided herein, including the description related to the function and operation of the sensing circuit 200, is sufficient to enable one of ordinary skill in the art to practice the invention.

Figure 7:
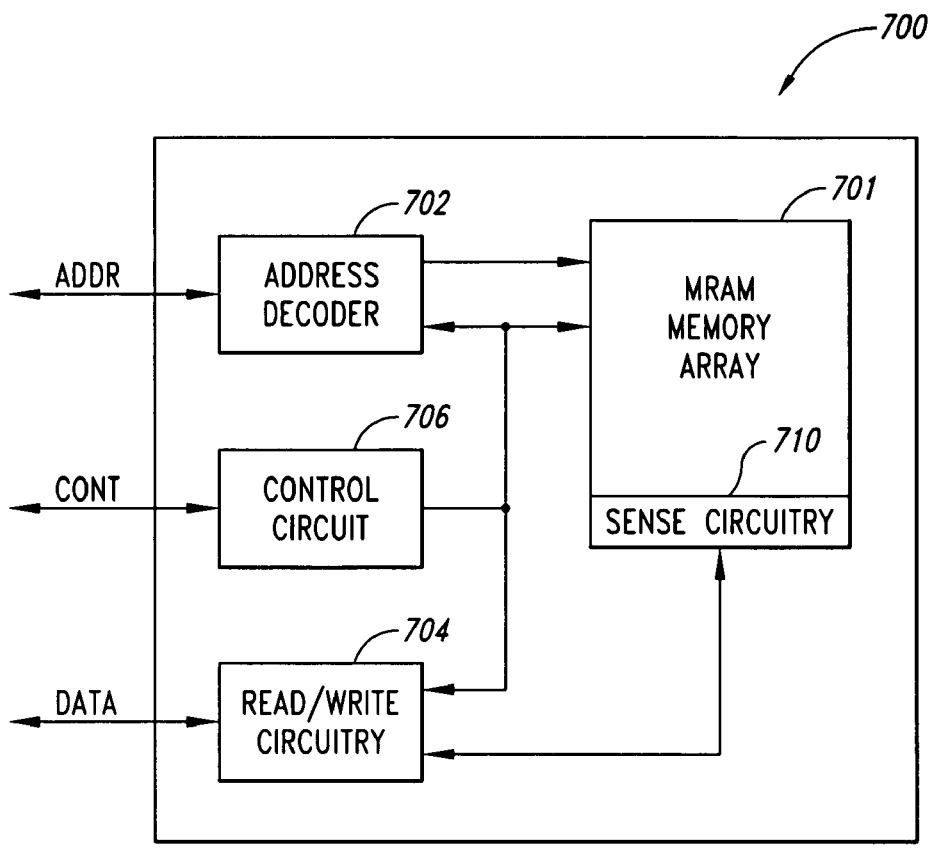
FIG. 7 is a functional block diagram illustrating an MRAM including a sensing circuit according to the present invention.

FIG. 7 is a simplified block diagram of a memory device 700 including an MRAM array 701 having sense circuitry 710 according to an embodiment of the present invention. The memory device 700 further includes an address decoder 702 that receives addresses from external circuitry (not shown), such as a processor or memory controller, on an address bus ADDR. In response to the received addresses, the address decoder 702 decodes the addresses and applies decoded address signals to access corresponding MRAM memory cells in the MRAM array 701. A read/write circuit 704 transfers data on a data bus DATA to addressed memory cells in the MRAM array 701 during write operations, and transfers data from addressed memory cells in the array onto the data bus during read operations. A control circuit 706 applies a plurality of control signals 708 to control the MRAM array 701, address decoder 702 and read/write circuit 704 during operation of the MRAM 700.

In operation, the external circuitry provides address, control, and data signals to the MRAM 700 over the respective ADDR, CONT, and DATA busses. During a write cycle, the external circuitry provides memory addresses on the ADDR bus, control signals on the CONT bus, and data on the DATA bus. In response to the control signals, the control circuit 706 generates controls signals 708, to control the memory-cell array 701, address decoder 702, and read/write circuitry 704. The address decoder 702 decodes the memory address on the ADDR bus and provides decoded address signals to select the corresponding memory cells in the memory-cell array 701. The read/write circuitry 704 receives write data on the DATA bus, and applies the write data to the memory-cell array 701 to store the data in the selected memory cells.

During a read cycle, the external circuitry provides a memory address on the ADDR bus and control signals on the CONT bus. Once again, in response to the control signals, the control circuit 706 generates controls signals 708 to control the memory-cell array 701, address decoder 702, and read/write circuitry 704. In response to the memory address, the address decoder 702 provides decoded address signals to access the corresponding memory cells in the array 701. The read/write circuitry 704 provides data stored in the addressed memory cells onto the DATA bus to be read by the external circuit. One skilled in the art will understand circuitry for forming the address decoder 702, read/write circuitry 704, and control circuit 706, and thus, for the sake of brevity, these components are not described in more detail. Although only a single array 701 is shown in the MRAM 700, the MRAM may include a plurality of arrays, and may also include additional components not illustrated in FIG. 7.

Figure 8:
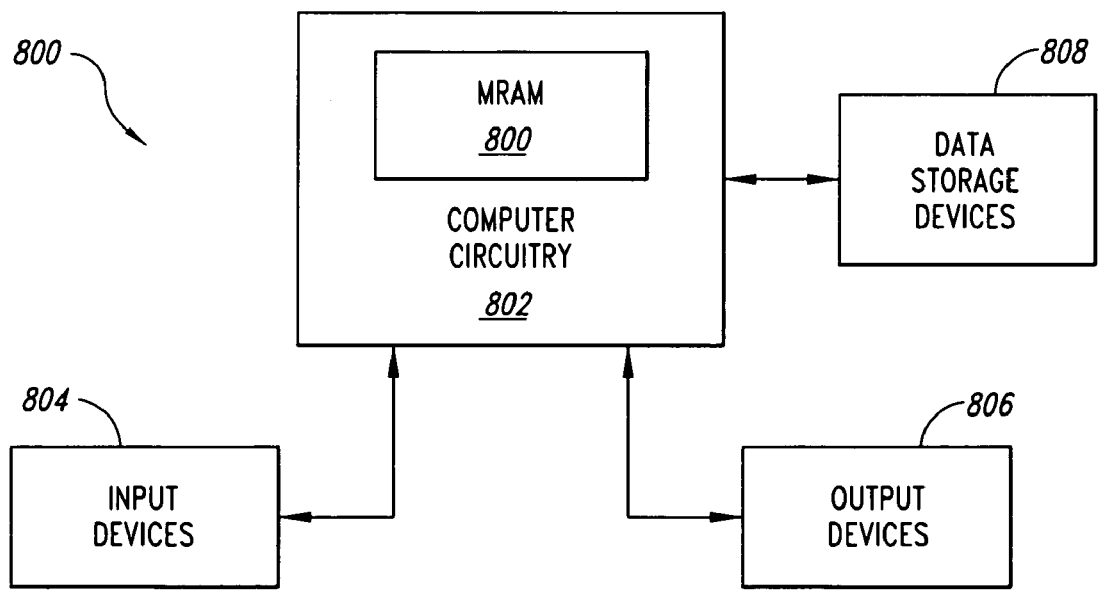
FIG. 8 is a functional block diagram illustrating a computer system including the MRAM of FIG. 5.

FIG. 8 is a block diagram of a computer system 800 including computer circuitry 802 that contains the MRAM 700 of FIG. 7. The computer circuitry 802 performs various computing functions, such as executing specific software to perform specific calculations or tasks. In addition, the computer system 800 includes one or more input devices 804, such as a keyboard or a mouse, coupled to the computer circuitry 802 to allow an operator to interface with the computer system. Typically, the computer system 800 also includes one or more output devices 806 coupled to the computer circuitry 802, such output devices typically being a printer or video display. One or more data storage devices 808 are also typically coupled to the computer circuitry 802 to store data or retrieve data from external storage media (not shown). Examples of typical storage devices 808 include hard and floppy disks, tape cassettes, compact disc read-only memories (CD-ROMs), read-write CD ROMS (CD-RW), and digital video discs (DVDs). Moreover, although the MRAM 700 is shown as being part of the computer circuitry 802, the MRAM can also be used as a data storage device 808 since, as previously described, the nonvolatile nature and speed of the MRAM make it an attractive alternative to other storage media devices such as hard disks.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A sensing circuit, comprising:
an integrator circuit having first and second integrator inputs electrically coupled to a sense node and a reference node, and first and second integrator outputs electrically coupled to first and second differential output nodes, the integrator circuit operable to periodically switch the electrical coupling of each of the first and second integrator inputs to a respective one of the sense and reference nodes and switch the electrical coupling of each of the first and second integrator output nodes to a respective differential output node; and
a comparator having first and second input nodes electrically coupled to the respective differential output node and further having a comparator output node, the comparator operable to periodically compare voltage levels of the first and second input nodes and generate an output signal having a logic state based therefrom.

2. The sensing circuit of claim 1 wherein the integrator circuit further comprises an amplifier circuit having a pair of differential input nodes respectively coupled to first and second integrator inputs and a pair of differential output nodes respectively coupled to the first and second integrator outputs.

3. The sensing circuit of claim 2 further comprising a feedback stage electrically coupled to the first and second integrator outputs of the integrator circuit and the amplifier circuit, the feedback stage configured to adjust the output current of the amplifier circuit based on the relative voltage levels of the first and second integrator outputs of the integrator circuit.

4. The sensing circuit of claim 1 wherein the comparator comprises a current source having first and second current output nodes coupled to a respective integrator output, the current source configured to switch the coupling of each current output node to an integrator output based on the logic state of the output signal of the comparator.

5. The sensing circuit of claim 4 wherein the integrator circuit comprises first and second capacitors coupled to a respective integrator output.

6. The sensing circuit of claim 1 wherein the period at which the integrator circuit switches the coupling of the differential input and output nodes is greater than the period at which the comparator compares the voltage levels of the first and second input nodes.

7. The sensing circuit of claim 1 wherein the comparator comprises:
   a clocked latch having a pair of complementary data nodes, first and second input terminals coupled to a respective output of the integrator circuit, the clocked latch operable to latch data states applied to the first and second input terminals; and
   a flip-flop electrically coupled to the complementary data nodes configured to provide an output signal indicative of the latched data states.

8. The sensing circuit of claim 7 wherein the clocked latch latches the data states at its first and second input terminals for a first half of the period at which the comparator compares voltage levels, and the clocked latch is set to a reference voltage level for a second half of the period.

9. The sensing circuit of claim 1 wherein the integrator circuit further comprises:
   a first switching circuit having a first pair of switches for electrically coupling the first integrator input to the first differential input node and the second integrator input to the second differential input node, and a second pair of switches for electrically coupling the first integrator input to the second differential input node and the second integrator input to the first differential input node; and
   a second switching circuit having a first pair of switches for electrically coupling the first differential output node to the first integrator output and the second differential output node to the second integrator output, and a second pair of switches for electrically coupling the first differential output node to the second integrator output and the second differential output node to the first integrator output.

10. The sensing circuit of claim 9 wherein the first pairs of switches of the first and second switching circuits are activated for the first half of the period at which the integrator circuit switches the coupling, and the second pairs of switches of the first and second switching circuits are activated for the second half of the period.

11. The sensing circuit of claim 1 further comprising a second integrator circuit having first and second inputs coupled to a respective output of the first integrator circuit, and having first and second outputs respectively coupled to the first and second input nodes of the comparator.

12. A memory device, comprising:
   an address bus;
   a control bus;
   a data bus;
   an address decoder coupled to the address bus;
   a control circuit coupled to the control bus;
   an MRAM array coupled to the address decoder and control circuit, the MRAM array having a plurality of word lines, a plurality of bit lines, a plurality of memory cells arranged in rows and columns, each memory cell in a respective row being coupled to a corresponding word line and each memory cell in respective column being coupled to a corresponding bit line; and
   a read/write circuit coupled to the data bus and the MRAM array, the read/write circuit including sensing circuits coupled to the bit lines, each sensing circuit comprising:
      an integrator circuit having first and second integrator inputs electrically coupled to a sense node and a reference node, and first and second integrator outputs electrically coupled to first and second differential output nodes, the integrator circuit operable to periodically switch the electrical coupling of each of the first and second integrator inputs to a respective one of the sense and reference nodes and switch the electrical coupling of each of the first and second integrator output nodes to a respective differential output node; and
      a comparator living first and second input nodes electrically coupled to the respective differential output node and further having a comparator output node, the comparator operable to periodically compare voltage levels of the first and second input nodes and generate an output signal having a logic state based therefrom.

13. The memory device of claim 12 wherein the integrator circuit further comprises an amplifier circuit having a pair of differential input nodes respectively coupled to first and second integrator inputs and a pair of differential output nodes respectively coupled to the first and second integrator outputs.

14. The memory device of claim 13 wherein the sensing circuit further comprises a feedback stage electrically coupled to the first and second integrator outputs of the integrator circuit and the amplifier circuit, the feedback stage configured to adjust the output current of the amplifier circuit based on the relative voltage levels of the first and second integrator outputs of the integrator circuit.

15. The memory device of claim 12 wherein the comparator comprises a current source having first and second current output nodes coupled to a respective integrator output, the current source configured to switch the coupling of each current output node to an integrator output based on the logic state of the output signal of the comparator.

16. The memory device of claim 15 wherein the integrator circuit further comprises first and second capacitors coupled to a respective integrator output.

17. The memory device of claim 12 wherein the period at which the integrator circuit switches the coupling of the differential input and output nodes is greater than the period at which the comparator compares the voltage levels of the first and second input nodes.

18. The memory device of claim 12 wherein the comparator comprises:
   a clocked latch having a pair of complementary data nodes, first and second input terminals coupled to a respective output of the integrator circuit, the clocked latch operable to latch data states applied to the first and second input terminals; and
   a flip-flop electrically coupled to the complementary data nodes configured to provide an output signal indicative of the latched data states.

19. The memory device of claim 18 wherein the clocked latch latches the data states at its first and second input terminals for a first half of the period at which the comparator compares voltage levels, and the clocked latch is set to a reference voltage level for a second half of the period.

20. The memory device of claim 12 wherein the integrator circuit further comprises:
   a first switching circuit having a first pair of switches for electrically coupling the first integrator input to the first differential input node and the second integrator input to the second differential input node, and a second pair of switches for electrically coupling the first integrator input to the second differential input node and the second integrator input to the first differential input node; and
   a second switching circuit having a first pair of switches for electrically coupling the first differential output node to the first integrator output and the second differential output node to the second integrator output, and a second pair of switches for electrically coupling the first differential output node to the second integrator output and the second differential output node to the first integrator output.

21. The memory device of claim 20 wherein the first pairs of switches of the first and second switching circuits are activated for the first half of the period at which the integrator circuit switches the coupling, and the second pairs of switches of the first and second switching circuits are activated for the second half of the period.

22. The memory device of claim 12 further comprising a second integrator circuit having first and second inputs coupled to a respective output of the first integrator circuit, and having first and second outputs respectively coupled to the first and second input nodes of the comparator.

23. A computer system, comprising:
   a data input device;
   a data output device;
   a processor coupled to the data input and output devices; and
   a memory device coupled to the processor, the memory device comprising,
   an address bus;
   a control bus;
   a data bus;
   an address decoder coupled to the address bus;
   a control circuit coupled to the control bus;
   an MRAM array coupled to the address decoder and control circuit, the MRAM array having a plurality of word lines, a plurality of bit lines, a plurality of memory cells arranged in rows and columns, each memory cell in a respective row being coupled to a corresponding word line and each memory cell in respective column being coupled to a corresponding bit line; and
   a read/write circuit coupled to the data bus and the MRAM array, the read/write circuit including sensing circuits coupled to the bit lines, each sensing circuit comprising:
      an integrator circuit having first and second integrator inputs electrically coupled to a sense node and a reference node, and first and second integrator outputs electrically coupled to first and second differential output nodes, the integrator circuit operable to periodically switch the electrical coupling of each of the first and second integrator inputs to a respective one of the sense and reference nodes and switch the electrical coupling of each of the first and second integrator output nodes to a respective differential output node; and
      a comparator having first and second input nodes electrically coupled to the respective differential output node and further having a comparator output node, the comparator operable to periodically compare voltage levels of the first and second input nodes and generate an output signal having a logic state based therefrom.

24. The computer system of claim 23 wherein the integrator circuit further comprises an amplifier circuit having a pair of differential input nodes respectively coupled to first and second integrator inputs and a pair of differential output nodes respectively coupled to the first and second integrator outputs.

25. The computer system of claim 24 wherein the sensing circuit further comprises a feedback stage electrically coupled to the first and second integrator outputs of the integrator circuit and the amplifier circuit, the feedback stage configured to adjust the output current of the amplifier circuit based on the relative voltage levels of the first and second integrator outputs of the integrator circuit.

26. The computer system of claim 23 wherein the comparator comprises a current source having first and second current output nodes coupled to a respective integrator output, the current source configured to switch the coupling of each current output node to an integrator output based on the logic state of the output signal of the comparator.

27. The computer system of claim 26 wherein the integrator circuit comprises first and second capacitors coupled to a respective integrator output.

28. The computer system of claim 23 wherein the period at which the integrator circuit switches the coupling of the differential input and output nodes is greater than the period at which the comparator compares the voltage levels of the first and second input nodes.

29. The computer system of claim 23 wherein the comparator comprises:
   a clocked latch having a pair of complementary data nodes, first and second input terminals coupled to a respective output of the integrator circuit, the clocked latch operable to latch data states applied to the first and second input terminals; and
   a flip-flop electrically coupled to the complementary data nodes configured to provide an output signal indicative of the latched data states.

30. The computer system of claim 29 wherein the clocked latch latches the data states at its first and second input terminals for a first half of the period at which the comparator compares voltage levels, and the clocked latch is set to a reference voltage level for a second half of the period.

31. The computer system of claim 23 wherein the integrator circuit further comprises:
   a first switching circuit having a first pair of switches for electrically coupling the first integrator input to the first differential input node and the second integrator input to the second differential input node, and a second pair of switches for electrically coupling the first integrator input to the second differential input node and the second integrator input to the first differential input node; and
   a second switching circuit having a first pair of switches for electrically coupling the first differential output node to the first integrator output and the second differential output node to the second integrator output, and a second pair of switches for electrically coupling the first differential output node to the second integrator output and the second differential output node to the first integrator output.

32. The computer system of claim 31 wherein the first pairs of switches of the first and second switching circuits are activated for the first half of the period at which the integrator circuit switches the coupling, and the second pairs of switches of the first and second switching circuits are activated for the second half of the period.

33. The computer system of claim 23 further comprising a second integrator circuit having first and second inputs coupled to a respective output of the first integrator circuit, and having first and second outputs respectively coupled to the first and second input nodes of the comparator.

* * * * *

UNITED STATES PATENT AND TRADEMARK OFFICE
CERTIFICATE OF CORRECTION

PATENT NO. : 7,330,390 B2 Page 1 of 1
APPLICATION NO. : 11/449546
DATED : February 12, 2008
INVENTOR(S) : Baker It is certified that error appears in the above-identified patent and that said Letters Patent is hereby corrected as shown below:

In column 12, line 24, in Claim 12, delete "living" and insert -- having --, therefor.

Signed and Sealed this

Tenth Day of June, 2008

JON W. DUDAS
*Director of the United States Patent and Trademark Office*